US006713318B2

(12) United States Patent
Maeda et al.

(10) Patent No.: US 6,713,318 B2
(45) Date of Patent: Mar. 30, 2004

(54) FLIP CHIP INTERCONNECTION USING NO-CLEAN FLUX (75) Inventors: Michihisa Maeda, Ibaraki-ken (JP); Kenji Takahashi, Ibaraki-ken (JP)

(73) Assignee: Intel Corporation, Santa Clara, CA (US)

( * ) Notice: Subject to any disclaimer, the term of this patent is extended or adjusted under 35 U.S.C. 154(b) by 136 days.

(21) Appl. No.: 09/820,547

(22) Filed: Mar. 28, 2001

(65) Prior Publication Data
US 2002/0142517 A1 Oct. 3, 2002

(51) Int. Cl.$^7$ ................................. H01L 21/44
(52) U.S. Cl. .................. 438/108; 438/106; 438/612; 438/613; 438/615; 438/663
(58) Field of Search ................. 438/108, 106, 438/612, 613, 615, 663

(56) References Cited

U.S. PATENT DOCUMENTS

| 5,019,673 | A | 5/1991 | Juskey et al. |
|---|---|---|---|
| 5,074,920 | A | 12/1991 | Gonsiorawski et al. |
| 5,111,279 | A | 5/1992 | Pasch et al. |
| 5,150,274 | A | 9/1992 | Okada et al. |
| 5,299,730 | A | 4/1994 | Pasch et al. |
| 5,410,805 | A | 5/1995 | Pasch et al. |
| 5,438,477 | A | 8/1995 | Pasch |
| 5,508,561 | A | 4/1996 | Tago et al. |
| 5,704,116 | A | 1/1998 | Gamota et al. |
| 5,710,071 | A | 1/1998 | Beddingfield et al. |
| 5,744,869 | A | 4/1998 | Root |
| 5,778,913 | A | 7/1998 | Degani et al. |
| 5,784,780 | A | 7/1998 | Loo |
| 5,785,234 | A | 7/1998 | Weiss et al. |
| 5,816,478 | A | 10/1998 | Kaskoun et al. |
| 5,942,798 | A | 8/1999 | Chiu |
| 6,011,312 | A | 1/2000 | Nakazawa et al. |
| 6,013,572 | A | * 1/2000 | Hur et al. .................... 438/614 |
| 6,051,889 | A | 4/2000 | Shimura |
| 6,057,168 | A | * 5/2000 | Seyama et al. ............. 436/616 |
| 6,059,894 | A | 5/2000 | Pendse |
| 6,087,732 | A | 7/2000 | Chittipeddi et al. |
| 6,103,549 | A | 8/2000 | Master et al. |
| 6,111,317 | A | 8/2000 | Okada et al. |
| 6,121,689 | A | 9/2000 | Capote et al. |
| 6,163,463 | A | 12/2000 | Marrs |
| 6,217,671 | B1 | * 4/2001 | Henderson et al. ............ 148/23 |
| 6,400,034 | B1 | * 6/2002 | Kimura et al. ............... 257/778 |

FOREIGN PATENT DOCUMENTS

| JP | 63-208251 | 8/1988 |
|---|---|---|
| JP | 63-004652 | 9/1988 |

OTHER PUBLICATIONS

Pooya Tadayon, Sort Test Technology Development, Intel Corporation. "Thermal Challenges Diring Microprocessor Testing".Intel Technology Journal Q3, 2000.Pp. 1–8.

(List continued on next page.)

Primary Examiner—Amir Zarabian
Assistant Examiner—Christy Novacek
(74) Attorney, Agent, or Firm—Blakely, Sokoloff, Taylor & Zafman LLP (57) ABSTRACT A flip chip method of joining a chip and a substrate is described. A thermo-compression bonder is utilized to align the chip and substrate and apply a contact force to hold solder bumps on the substrate against metal bumps on the chip. The chip is rapidly heated from its non-native side by a pulse heater in the head of the bonder until the re-flow temperature of the solder bumps is reached. Proximate with reaching the re-flow temperature at the solder bumps, the contact force is released. The solder is held above its re-flow temperature for several seconds to facilitate wetting of the substrate's metal protrusions and joining. A no-clean flux that has a volatilization temperature below the melting point of the solder bumps is utilized to minimize or eliminate the need for a post interconnection de-flux operation.

12 Claims, 7 Drawing Sheets

OTHER PUBLICATIONS

Dory, Takahashi, Kume, Kubota, Seki and Fujiyama, "Simultaneous Chip–Join and Underfill Assembly Technology for Flip–Chip Packaging". Intel Technology Journal Q3, 2000. Pp. 1–7.

Polka, Chickamenahalli, Chung, Figueroa, Li, Merley, Wood and Zu, "Package–Level Interconnect Design for Optimum Electrical Performance". Intel Technology Journal Q3, 2000. Pp. 1–17.

Viswanath, Wakharar, Watwe and Lebonheur, "Thermal Performance Challenges from Silicon to Systems". Intel Technology Journal Q3, 2000. Pp. 1–16.

Nicholas P. Mencinger, Assembly Technology Development and Reliablity, Intel Corp. "A Mechanism–Based Methodology for Processor Package Reliablity Assessments". Intel Technology Journal Q3, 2000. Pp. 1–8.

John H. Lau, "Flip Chip Technologies",1995 (Electronic Packaging and Interconnection Series) (P–5–K2D36). McGraw–Hill Companies Inc. © 1996. Pp. 1–565.

David Lammers, Flip Chip Packages Go Mainstream, Webpage[online].EE Times.com, Aug. 17, 2000. [Retrieved on Oct. 6, 2000] Retrieved from the Internet:<URL: www.eetimes.com/story/OEG20000817S0024 pp. 1–5.

Nasser Grayeli, Microprocessor Packaging: Evolution and Future Challenges, WebPage.[online]. Developer Intel, © 2000.[Retrieved on Oct. 5, 2000] Retrieved from the internet:<URL: http://developer.intel.com/technology/itj/q32000/foreword.htm.P. 1–2.

SmartDie® product Manufacturing and Use, WebPage[online] Developer.Intel.com, © 2000. [Retrieved on Oct. 5, 2000.]. Retrieved from the Internet:<URL:http://developer.intel.com/design/smartdie/COB.HTM. Pp. 1–10.

Valtronic News– Everything you wanted to know about the Flip Chip, WebPage [online]. Mar. 1999 Issue. [Retrived on Oct. 6, 2000.] Retrieved from the internet:<URL:http:www.valtronic.ch/valtronicnews/0399issue/fc.html. Pp. 1–5.

Fluxes, WebPage [online]. [Retrieved on Oct. 20,2000.] Retrieved from the Internet:<URL: www.intelligentdispensing.com/fluxes.htm.

7.0 Board Assembly Effects, WebPage [online]. [Retrieved on Oct. 20, 2000]. Retrieved from the.Composition and Graph diagram, WebPage [online]. [Retrieved on Oct. 24, 2000.] Retrieved from the Internet:<URL: http:www.sv.vt-.edu/classes/MSE2094_NoteBook/96ClassProj/pics/Pb_Sn.GIF.p. 1.

Composition and Graph diagram, WebPage [online]. [Retrieved on Oct. 24, 2000.] Retrieved from the Internet:<URL: http:www.sv.vt.edu/classes/MSE2094_NoteBook/96ClassProj/pics/Pb_Sn.GIF.P. 1.

ORS Research Safetly News, WebPage [online]. Northwestern University. Research Safety News Article– Lead–free Solder. Safer Solder Swap Suggestion: Lead–free Solder. vol. 16, No. 3. Jul., 2000. [Retrieved on Oct. 24, 2000] Retrieved from the Internet:<URL:http://www.nwu.edu/reseqarch–safety/news/articles/2000articles/1603leadfree.htm p. 1.

Lead free solders—current trends, technology update. WebPage [online].Microtechnology & Reliabilty Centre, Newsletter 3.[retrieved on Oct. 24, 2000] Retrieved from the Internet:<URL:www.twi.co.uk/news/micro–newslet3.html.P. 1–4.

Approach to BGA Lead–Free, WebPage [online]. [Retrieved on Oct. 24, 2000] Retrieved from the Internet:<URL:http://www.fujitsu.co.jp/hypertext/Products/Device/CATALOG/AD81/81–00004–2e–4.html pp. 1–4.

Manufacturing Test Industry Solutions—Lead Free Solder, Webpage [online]. Agilent Technologies, © 2000.[retrieved on Oct. 24, 2000] Retrieved from the Internet:<URL:http://www.ate.agilent.com/emt/industry/leadfreesolder/index.shtml.P. 1.

The Lead Free Interconnect Project: Statement of Work. WebPage [online]. [retrieved on Oct. 24, 2000] Retrieved from the Internet:<URL:www.nemi.org/PbFreePUBLIC/Project/SOW.html.> p. 1–6.

No–Clean Technology Review. WebPage [online]. Supercritical Carbon–dioxide Cleaning Technology Review, released in Oct. 1996. [retrieved on Oct. 26, 2000] Retrieved from the Internet:<URL:http://www.pprc.org/pprc/p2tech/noclean/nointro.html. Pp. 1–4.

Mirng–Ji Lii, Bob Sankman, Hamid Azimi, Hwai Peg Yeoh & Yuejin Guo. "Flip–Chip Technology on Organic Pin Grid Array Packages" Intel Technology Journal Q3, 2000. Pp. 1–9.

Ravi Mahajan, Ken Brown & Vasu Atluri. "The Evolution of Microprocessor Packaging". Intel Technology Journal Q3, 2000. Pp. 1–10.

Greig, et al., "A Review of Thermocompression Flip Chip Assembly," *Electronic Packaging & Production*, Jul. 1997, pp. 70–74.

* cited by examiner

FLIP CHIP INTERCONNECTION USING NO-CLEAN FLUX

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The invention relates generally to the field of semiconductor chip packaging. More particularly, the invention relates to the joining of the semi-conductor chip and a substrate using a flip chip process.

2. Description of the Related Art

Traditionally, semi-conductor chips have been electrically coupled to electrical traces on a substrate via wire interconnects that are soldered on one end to the top area of a chip and soldered to trace pads on the substrate that surround the chip on the other end. These types of interconnects are not particularly space efficient, requiring area for both the footprint of the chip and a trace pad perimeter. To more efficiently utilize the substrate surface and facilitate smaller chip packages, the flip chip interconnection process was developed. Essentially, the active surface of the semi-conductor chip is flipped over to face the substrate and the chip is soldered directly to trace pads located adjacent to the active surface. The result is a more compact and space efficient package.

One of the most successful and effective methods of electrically connecting a flipped chip to a substrate utilizes controlled-collapse chip connection technology (the C4 process developed by Intel Corporation of Santa Clara Calif.). Details of this process will be described below with reference to FIG. 1. Briefly, the process consists of applying solder bumps to pads on the substrate. A flux is applied to at least one of the surfaces to be joined to isolate the surface from the atmosphere and provide an adhesive force to hold the chip to the substrate during the process. The solder is then re-flowed, finally, a wash and bake cycle may be used to clean the package.

An epoxy under-fill is applied between the active surface of the chip and the top surface of the substrate to surround and support the solder interconnects. Under-filling significantly increases the reliability and fatigue resistance of the package's interconnections. The under-fill helps to more evenly distribute stress caused by thermally induced strains due to the differences in coefficients of thermal expansion (CTE) between the chip and substrate across the entire surface of the chip and substrate. If the gap between the interconnected chip and substrate were not under-filled, the stress would be carried by the relatively thin solder interconnects, often resulting in premature package failure. However, in order for the under-fill to perform properly, it must be well adhered to the chip and substrate surfaces. Even a thin film of flux residue can cause premature delamination of a bonded surface, eventually resulting in failure in one or more of the interconnects. Accordingly, one of the great challenges using C4 technology has been to completely remove all flux residues from the package. This has become especially troublesome as the thickness of the gap between the chip and the substrate has decreased.

The total throughput time (TPT), or the time it takes to create a soldered chip, is affected significantly by the time required to remove absorbed water from chip and substrate which can be particularly time-consuming. For instance, chemical defluxing may take minutes, while a post-bake to remove absorbed water from chip and substrate may take several hours. Fluxes have been developed that completely volatilize at elevated temperature. However, because the flux is required in the C4 process to hold the chip and substrate together before re-flow, only those fluxes that have volatilization temperature at or above the solder melting point are suitable for use with the C4 process. The small thickness of the gap distance between the chip and the substrate coupled with the flux's high volatilization temperatures, however, make it difficult, if not impossible, to boil off all of the flux residues during the re-flow process or in a subsequent post-bake operation at a temperature slightly below solder melting temperature. The long post-bake times and defluxing operations required to volatize the flux eliminate any opportunity for significant TPT reductions.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which:

FIGS. 4A–D illustrates embodiments of a chip and substrate during various operations during the interconnection process.

DETAILED DESCRIPTION OF THE INVENTION

A flip chip method for the interconnection of a chip to a substrate utilizing a no-clean flux having a low volatilization temperature is described. Through the use of a thermo-compression bonder (or a similarly equipped apparatus) that uses contact pressure to hold the chip and the associated substrate in general alignment prior to re-flow of the solder bumps, the need to use a flux that can adhesively hold the chip and substrate together until solder bump re-flow is eliminated. Accordingly, a no-clean flux having a volatilization temperature below the melting temperature of the solder may be specified whereby most, if not substantially all, of the flux is volatilized during a brief hold at the solder re-flow temperature. In alternative embodiments, a short post-heat period may be utilized to ensure the no-clean flux has been completely volatilized. Advantageously, the use of the low volatilization no-clean flux in conjunction with a thermo-compression bonder results in significantly reduced TPT's, as well as higher integrity bonds than is typical using conventional C4 processing. For purposes of this disclosure, a no-clean flux is one that includes constituents that completely volatilize at a specific temperature, leaving no solid residue.

Figure 1:
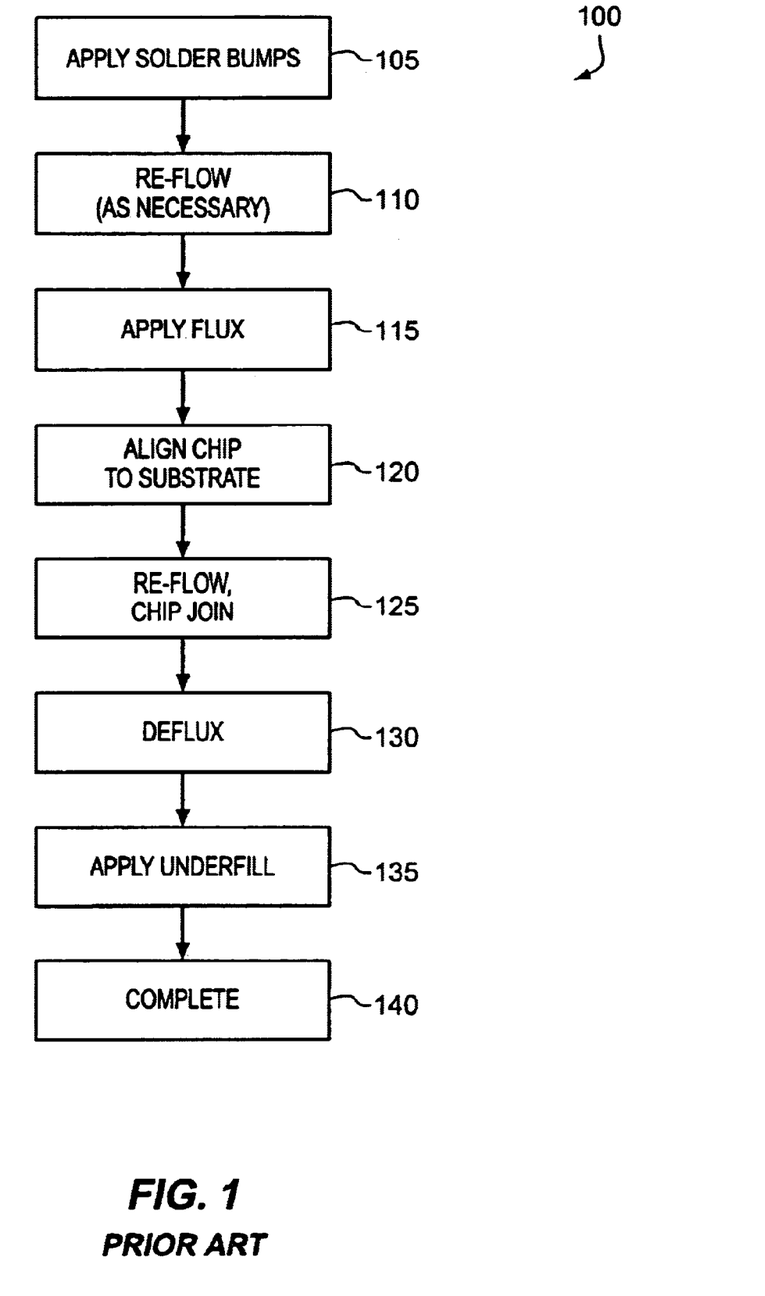
FIG. 1 is a prior art flow diagram illustrating the operations typically required to create a flip chip bond using a C4 joining process.

FIG. 1 illustrates the C4 process. First, as shown in processing block 105, solder bumps are typically applied to pads on the substrate using any number of suitable processes including printing (using solder paste for the C4 process), plating and vapor deposition. Generally, lead-tin solders having melting points below 200 degrees Celsius are used. Next, in processing block 110, the solder bumps are re-flowed by heating the solder bumps to a temperature above the solder's melting point to fully wet the solder bumps to their respective pads. Typically, metal bumps, or protrusions having a high lead content, are deposited on the corresponding chip pads.

In processing block 115, a flux is applied to at least one of the surfaces to be joined. Typically, the flux includes a vehicle and an activator. The flux vehicle acts to isolate the surface of the solder from the atmosphere during a second re-flow, minimizing the risks of oxidation while the solder is hot and/or molten. The flux vehicle is generally tacky and provides an adhesive force to hold the chip and substrate together prior to the second re-flow. The activator is typically an organic or inorganic acid that removes any oxides or surface films present on the solder, facilitating solder wetting of the metallic surfaces to be joined. In processing block 120, the flux bearing surfaces of the chip and substrate are placed in contact with each other in general alignment.

Next, as illustrated in processing block 125, the second re-flow is performed by heating the chip and substrate package to a temperature above the solder's melting point. The molten solder bumps wet the corresponding metal bumps and the surface tension of the molten solder causes the metal bumps to self-align with each of the corresponding substrate pads. The newly formed interconnects are then cooled to solidify the solder.

Any flux or flux residue is removed from the chip and substrate package in a defluxing operation as indicated in processing block 130. This operation will typically include solvent washing the package to remove flux residue. A post-interconnection bake cycle may also be specified to volatilize any remaining solvent or low boiling point flux constituents. Water-soluble fluxes are commonly used for C4 application and water is used for defluxing. The primary purpose of the bake cycle is to remove the water, which is absorbed into chip and substrate during defluxing, since such absorbed water would be the cause of voids during under-filling.

Figure 2:
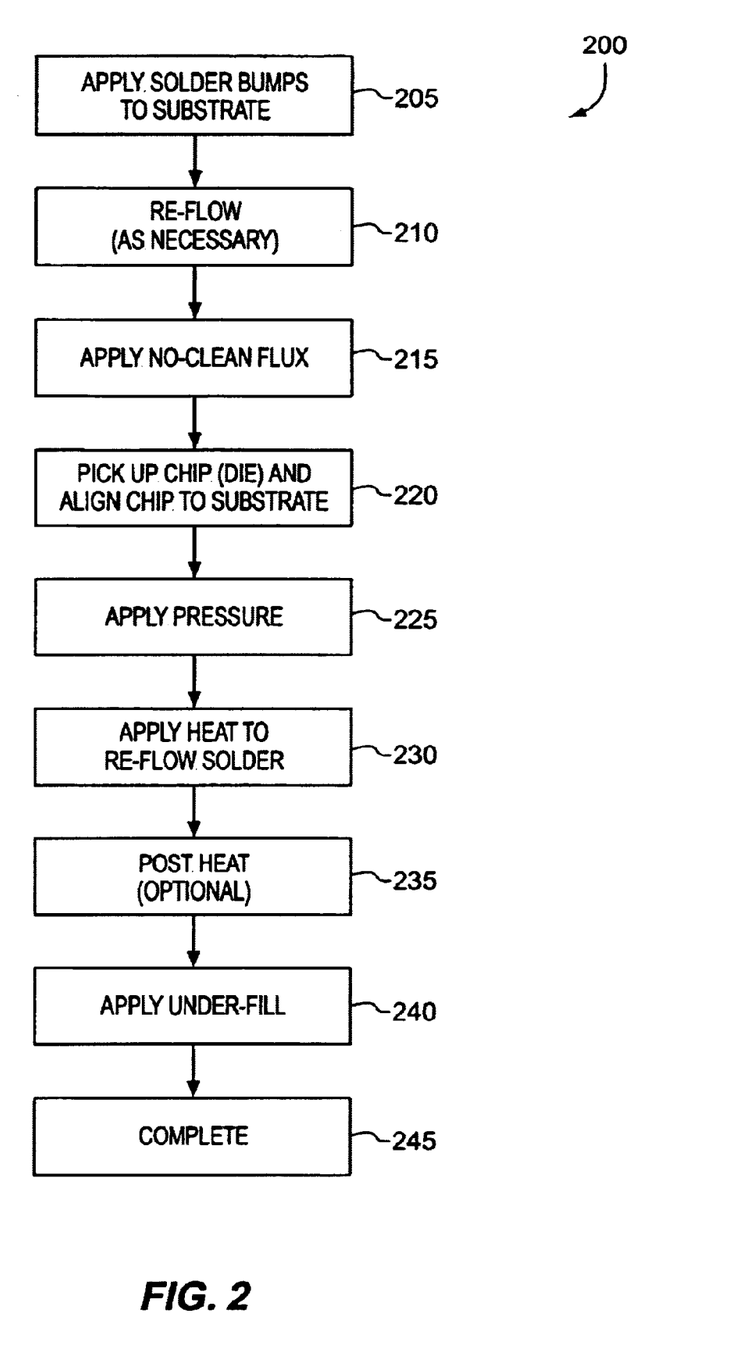
FIG. 2 is a flow diagram of one embodiment of a joining process.

FIG. 2 is a flow diagram for one embodiment of a joining process utilized according to one embodiment of the present invention. First, as indicated in processing block 205, a solder is applied to bond pads on the top surface of the substrate. One of ordinary skill in the art will appreciate that in alternative embodiments the solder may be applied to bond pads on the chip (die) as well. The solder may be applied to the bond pads using any number of suitable techniques known to those skilled in the art, including, but not limited to, printing, vapor deposition and electroplating. After the solder is applied, the substrate is heated to beyond the solder's melting point to re-flow the solder as indicated in processing block 210 to facilitate complete wetting of the bond pads. In one embodiment, a 96.5% tin/3.5% silver eutectic solder with a melting point of around 221 degrees Celsius is specified, although any number of suitable solder compounds may be utilized. Ideally, lead-free solders are specified, eliminating the potential environmental problems caused by lead.

Figure 3:
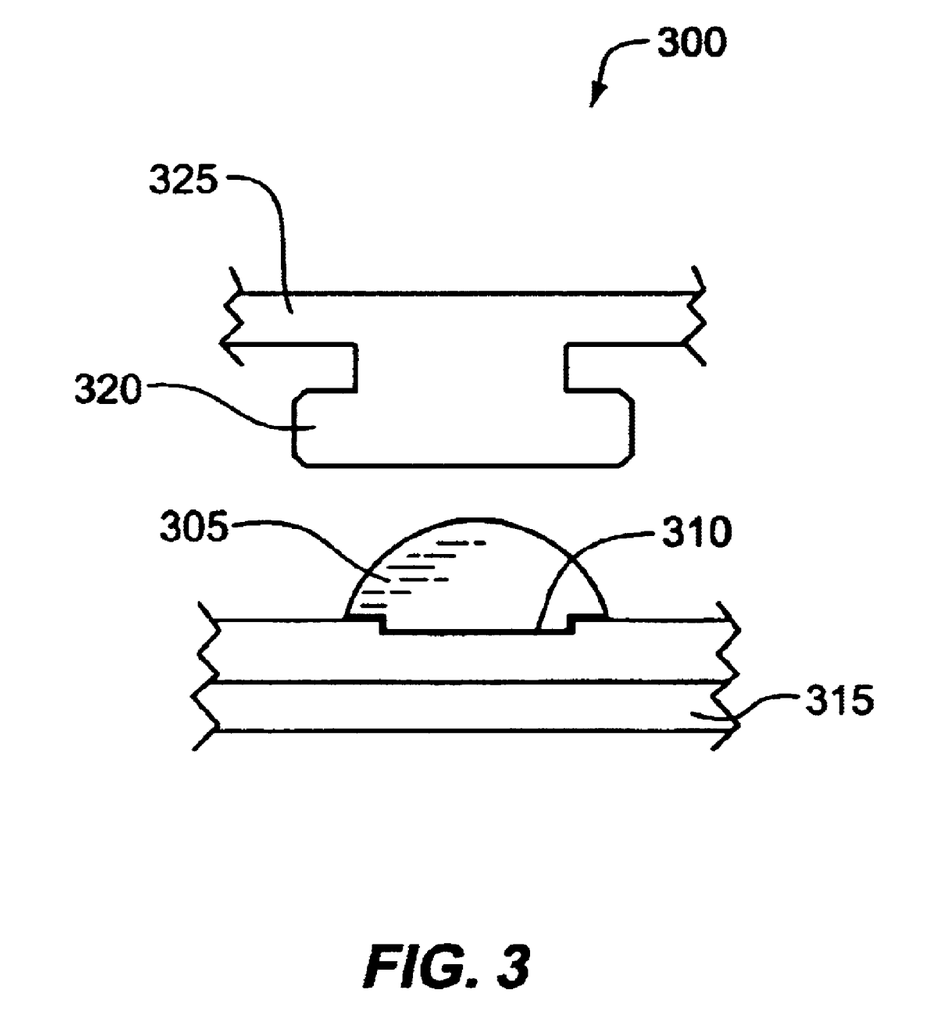
FIG. 3 illustrates one embodiment a solder bump that has been applied to a bonding pad on a substrate and re-flowed, as well as a copper base metal bump that has been applied to a bonding pad on the top surface of a chip.

Typically, a metal bump is applied to the bond pads on the chip, although in alternative embodiments the bump metal pad may be applied to the substrate instead. The bump metal pad may be applied to the bonding pad by any number of methods as would be known to one skilled in the art. Ideally, the bump metal has good electrical conductivity and reasonable resistance to oxidation at the elevated joining temperatures. Traditionally, an oxidation-resistant, lead-based bump metal such as a 97% Pb/3% Sn alloy has been utilized in conventional C4 flip chip joining processes. Lead-based bump metals, and solders for that matter, provide necessary oxidation resistance during the furnace temperature ramp up and hold times utilized in a conventional C4 process. In embodiments of the present invention, the ramp up and hold times are relatively short (e.g 100 degrees @second ramp and 1–5 second hold). Thus, the potential for significant oxidation is minimized and a more reactive base metal with superior electrical properties may be utilized in the metal bumps. In one embodiment, a copper base metal bump is specified. FIG. 3 illustrates a solder bump 305 that has been applied to a bonding pad 310 on a substrate 315 and re-flowed, as well as a copper base metal bump 320 that has been applied to a bonding pad on the top surface of a chip 325.

Figure 4:
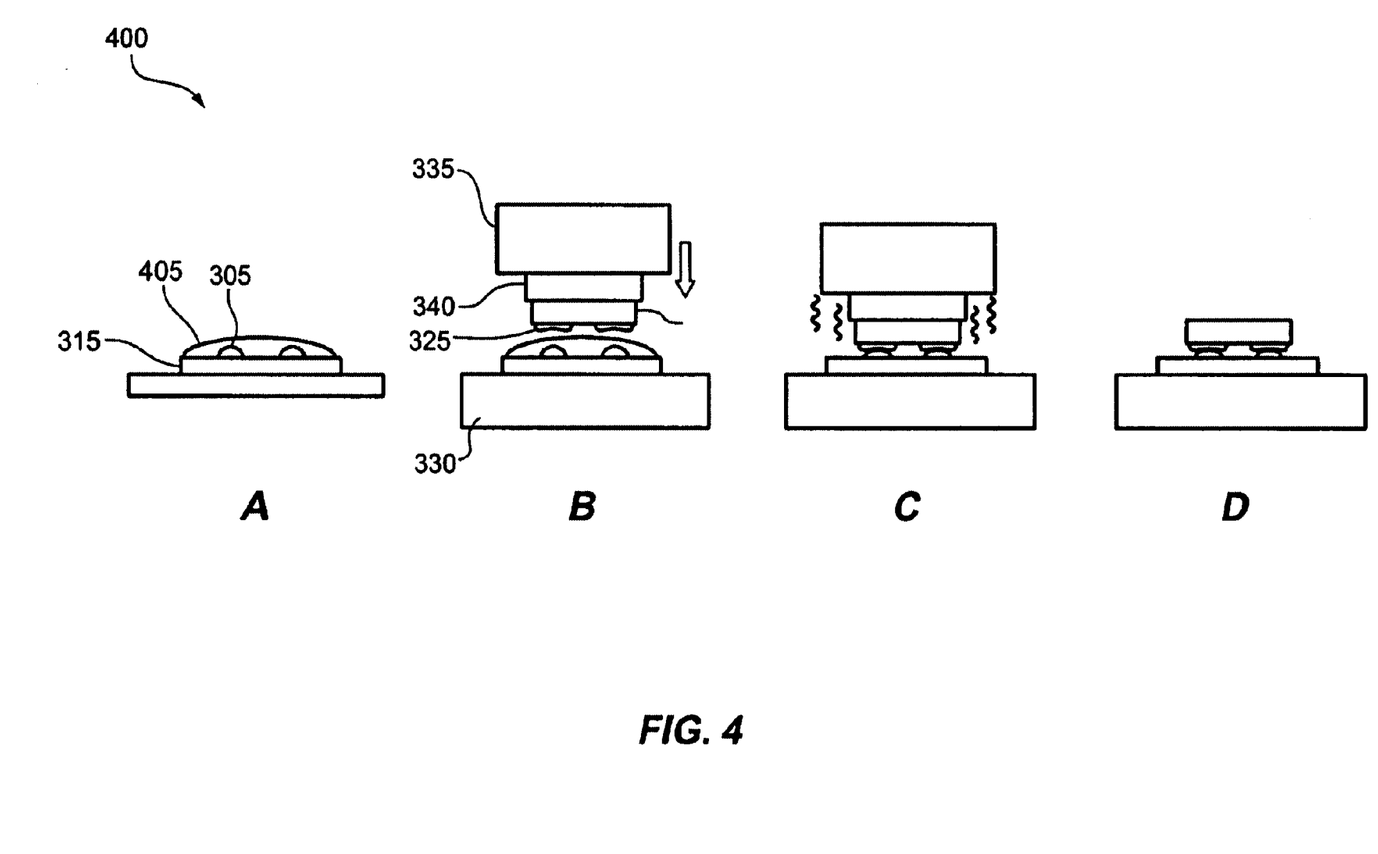

Referring back to FIG. 2, in processing block 215 a no-clean flux is applied to the solder bumped surface of the substrate. A solder bumped substrate 315 is illustrated in FIG. 4A with a no-clean flux 405 applied to its top surface, substantially encapsulating the solder bumps 305. The primary functions of the no-clean flux 405 is to remove oxide and other contaminants from the surface of the solder bumps 305 and the base metal bumps 320, and prevent new oxide films from forming on the base metal and solder bumps during the interconnection process. In typical C4 bonding processes, fluxes serve an additional purpose of adhesively holding the chip and substrate together until the re-flow temperature was reached during joining. Accordingly, even no-clean fluxes used in the C4 process have constituents that have boiling points above the melting points of the solder bumps. Since pressure applied by the thermo-compression bonder is used to hold the chip and substrate together prior to re-flow in the preferred embodiments of the invention, no-clean fluxes consisting entirely of constituents with boiling points of less than the melting point of the solder may be utilized. In one embodiment, a carboxylic acid no-clean flux is utilized having a boiling point of around 200 degrees Celsius.

Referring to processing block 220 of FIG. 2, the chip 320 is picked up by the head of the thermo-compression bonder and aligned with the substrate 315. The substrate 315 is typically placed on a heated platen 330 as shown in FIG. 4B. The platen 330 is generally held at a constant temperature below the melting point of the solder 305. In one embodiment, a temperature of around 135 degrees Celsius is specified. Likewise, the die head 335 may be maintained at an intermediate temperature, typically between 30 to 100 degrees Celsius. The die head 335 may comprise an internal heating element or, as shown in FIG. 4B, a pulse heat tool 340 capable of very rapid heating (e.g., greater than 25 degrees Celsius @ second) may be utilized.

Next, in processing block 230, the interconnection cycle is commenced. First, as shown in FIG. 4C, the base metal bumps 325 of the chip 315 are brought into contact with corresponding solder bumps 305 on the substrate 315 and pressure is applied as the pulse heat tool 340 is rapidly heated to a temperature well in excess of the melting point of the solder bumps 305.

Figure 5:
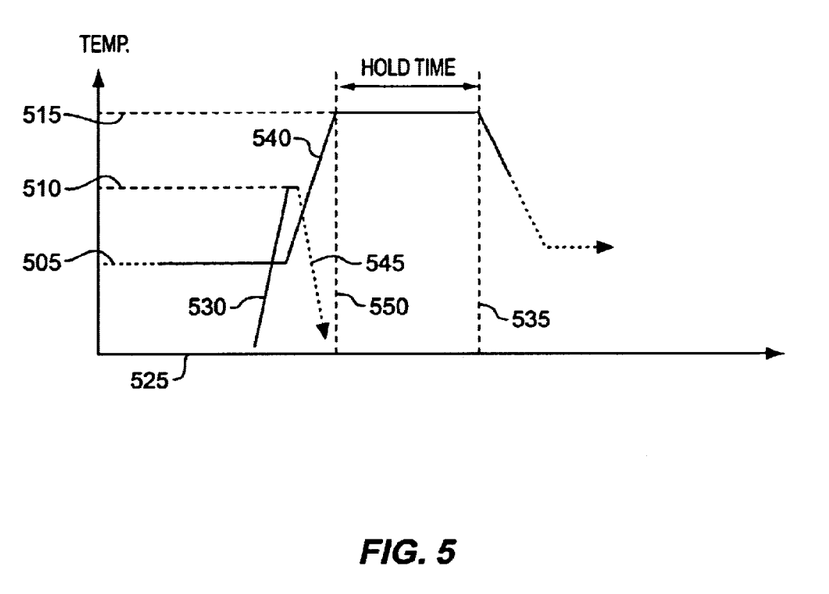
FIG. 5 illustrates one embodiment of a diagram for a joining cycle.

FIG. 5 illustrates one embodiment of a joining. Line 540 represents the temperature of the pulse heat tool 340 at a given time during the cycle. Line 545 is a pressure curve indicating the amount of force applied to the interface between the metal bumps 325 and the solder bumps 305 at a given time. Initially, as discussed supra, the pulse heat tool is maintained at an intermediate temperature such as 30 degrees Celsius. The chip is picked up by the thermo-compression bonder head at time 525. The chip and substrate are aligned and the chip is brought into contact with the substrate and pressure is applied at around time 530. Typically, a force of 2 to 5 kilograms is applied depending on the dimensions of the chip and the number of flip chip connections to be made. Also at time 530, the pulse heat tool is energized and rapidly heated to its hold temperature. In one embodiment, heat-up rates on the order of 100 degrees Celsius are specified. The peak hold temperature 515 is typically on the order of 250 to 400 degrees Celsius depending on several factors, including the thickness of the chip, the thermal conductivity of the chip, and the melting point and desired re-flow temperature of the solder bumps 305.

Typically, a temperature gradient will be established through the chip such that the temperature at the interface with the solder bumps 305 will be less than the temperature at the interface with the pulse heat tool 340. Accordingly, the hold temperature 515 of the pulse heat tool will typically be greater than the re-flow temperature of the solder bumps 305. At about time 550 when the hold temperature 515 has been reached, the pressure applied to the chip is nearly reduced to zero as indicated by pressure curve 545. At about or just prior to time 550, the melting temperature of the solder is reached at the interface between the chip and the substrate and pressure is no longer required to hold the chip and substrate together. While the pulse heat tool is held at temperature 515, the solder bumps melt and re-flow. The pulse heat tool is maintained at temperature 515 for a short period of time, typically 1 to 5 seconds, after which the pulse heat tool 340 is de-energized and the solder solidifies shortly thereafter. Once the pulse heat tool has reached a temperature 510, the bonded chip and substrate are removed from the thermo-compression bonder, freeing the bonder to perform another chip join.

During the heat-up phase of the chip join, the interface between the chip and substrate reaches a temperature in excess of the boiling point (or volatilization point) of the no-clean flux. As discussed supra, the no-clean flux of the preferred embodiment is comprised of carboxylic acid which boils at a temperature of 200 degrees Celsius. Ideally, substantially all of the flux volatilizes during the heat-up phase and is not present during the re-flow of the solder. A lack of flux to protect the solder and base metal from the oxidizing effects of elevated temperatures would normally be of concern. However, given the rapid heat-up rate of the pulse tool, the time in which the solder and base metal are unprotected prior to melting and re-flow is generally insignificant. Furthermore, the gaseous flux volatiles form a temporary protective cloud around the solder bumps substantially preventing oxygen molecules from impinging on the joining surfaces prior to melting and re-flow.

Figure 6A:
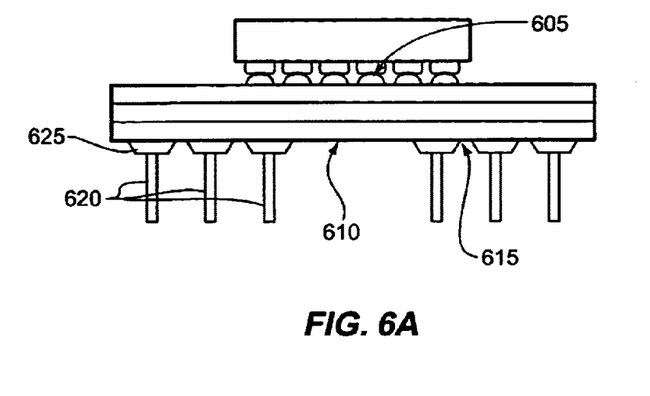
FIG. 6A is an illustration of one embodiment of a chip/substrate package.
Figure 6B:
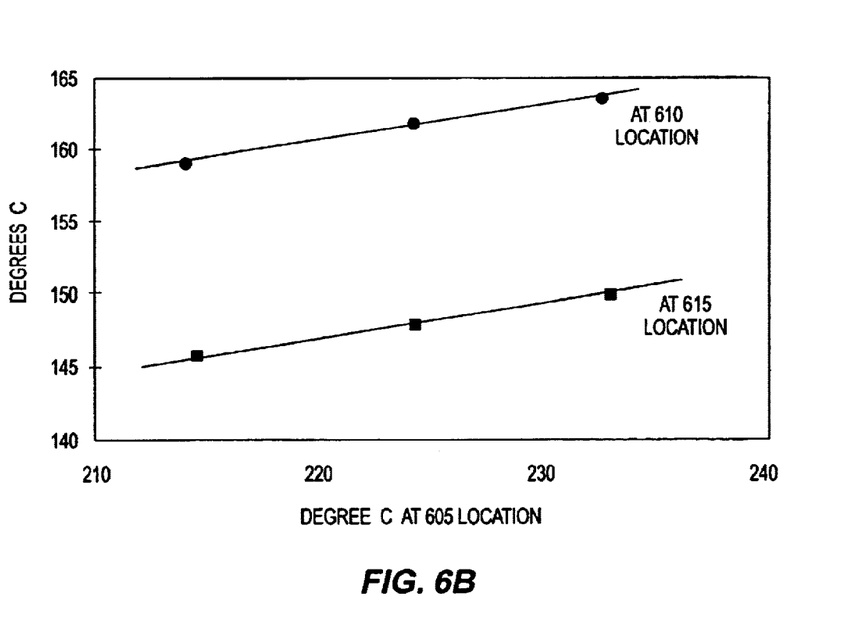
FIG. 6B is a chart derived from experimentation indicating the temperatures observed at several locations on the chip and substrate during a chip interconnection process performed according to an embodiment of the present invention.

In one embodiment, as mentioned supra, a 96.5% Sn 3.5% Ag solder is utilized to form the solder bumps. This solder has a melting point of approximately 221 degrees Celsius and requires a re-flow temperature at least a few degrees greater than the melting point. As discussed supra, typical methods such as C4 utilize lead based solders (such as 37% lead 63% tin) that have melting points of less than 190 degrees Celsius. The lower melting point solders are especially necessary when joining a chip to a pinned substrate using a C4 process since temperatures in excess of 210 degrees Celsius can cause softening of the pinning solder (typically, 95% tin 5% antimony which begins melting around 232 degrees Celsius), resulting in movement of the pins. In one embodiment using a 96.5% Sn 3.5% Ag solder, the temperature of the pinning solder does not exceed 200 degrees Celsius. The temperature gradient between the chip-to-pulse heat tool interface at the high end and the platen-to-substrate interface at the low end never has the opportunity to equalize in the short time the pulse heat tool is energized. FIG. 6A is an illustration of a chip/substrate package wherein the substrate includes a pin grid array (PGA). The pins 620 of the PGA are held in place by pinning solder 620. FIG. 6B is a chart derived from experimentation indicating the temperatures observed at several locations on the chip and substrate during a chip join performed according to one embodiment. The temperatures listed along the horizontal axis indicate the temperature at the center of the chip join region 605. It is noted that the melt and re-flow of the preferred solder typically occurs at temperatures between 220 and 235 degrees Celsius. The top line indicates the corresponding temperature at the center of the pin grid array side of the substrate. The bottom line indicates the corresponding temperature at the edge of the pin grid array side of the substrate. As is indicated by FIG. 6B, the temperature on the pin grid array side of the substrate never exceeds 165 degrees Celsius, while the melt temperature of the solder bumps are reached and exceeded to facilitate re-flow and joining.

Figure 7:
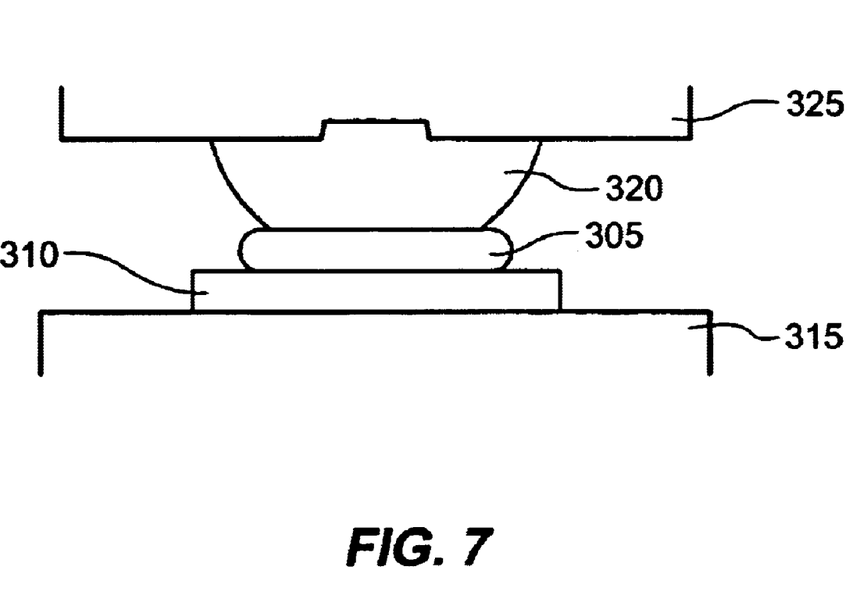
FIG. 7 is a photograph of a cross-sectional view of a cross-sectioned interconnect joint.

Referring back to FIG. 2, the gap between the chip and the substrate is typically under-filled with an epoxy resin to substantially increase the longevity, environmental resistance, and fatigue strength of the interconnects as indicated by block 240. In order to obtain the maximum benefits from the under-filling operation, the surfaces to be bonded should be free of flux or other residue. Accordingly, in certain embodiments, a post-heat operation may be performed to ensure that any residual flux that could negatively impact the subsequent under-fill bond is removed. The interconnected chip and substrate may be heated in an oven for an appropriate period of time at or slightly above the volatilization temperature of the no-clean flux as indicated in block 235. For example, a chip substrate package joined according to one embodiment where a carboxylic acid flux with a 200 degrees boiling point is used will be baked at least 200 degrees Celsius for 10 minutes. Unlike with typical flip chip joining processes in which the flux does not volatize below the re-flow temperature of the solder bumps, little or no time-consuming, solvent-based defluxing operations need be performed, significantly reducing the TPT. Additionally, the volatilization of the flux prior to melt and re-flow helps facilitate a low porosity bond with high integrity as shown in FIG. 7, a cross-sectional view of an interconnect joint.

Testing has been performed of under-filled surfaces of a chip/substrate package in which a carboxylic having a boiling point of 235 degrees Celsius was used during interconnection. No solvent-based deflux operation was performed on the package prior to under-fill. After 168 hours in a steam atmosphere, nearly 13.6% of the under-fill bonds have delaminated due primarily to flux residue that was unable to volatilize during the re-flow process. A post-heat bake performed at the boiling point of the 235 degree carboxylic acid flux is not feasible as the flux's boiling point is above the melting point of the solder, not to mention the melting point of the pinning solder. Testing of the under-filled surfaces of a chip/substrate package has also been performed in which a carboxylic having a boiling point of 200 degrees Celsius was used during interconnection and a 10 minute post heat at 200 degrees Celsius was performed prior to under-filling. In these tests, almost no delamination (0.6%) is present after the 168 hours in a steam atmosphere, indicating very little, if any, flux residue was present during the under-fill operation.

Alternative Embodiments

In the foregoing description, for the purposes of explanation, numerous specific details have been set forth in order to provide a thorough understanding of the present invention. The detailed description and embodiments discussed herein are not intended to limit the scope of the invention as claimed. To the contrary, embodiments of the claims have been contemplated that encompass the full breadth of the claim language. Accordingly, the present invention may be practiced without some of the specific detail provided herein.

For instance, the embodiments of the invention have been described above primarily in terms of a flip chip joining process using a thermo-compression bonder. It is conceivable that other apparatus may be used to accomplish the limitations of the claims as would be obvious to one of ordinary skill in the art. Likewise, although the process has been described in terms of an exemplary embodiment wherein a 96.5% tin/3.5% silver solder is used along with a carboxylic acid flux having a 200 degree boiling point, other suitable solder and flux combinations are contemplated. In one embodiment, the pressure applied to the chip against the substrate is removed once the solder bumps have begun to melt, however alternative embodiments are contemplated wherein at least some pressure is maintained against the chip throughout the interconnection process.

What is claimed is:

1. A method, comprising:
   placing a substrate against a first fixture,
   the substrate having deposited thereon a plurality of solder bumps and a flux, the solder bumps having a melting point at a first temperature, and the flux having a volatilization temperature at which substantially all of the constituents of the flux volatilize, the volatilization temperature being less than or equal to the first temperature,
   the first fixture being maintained at a second temperature below the first temperature;
   placing a chip against a second fixture,
   the chip having affixed thereto a plurality of metal protrusions,
   the second fixture coupled with a heater, the heater being maintained at a third temperature, the third temperature being less than the first temperature;
   bringing the plurality of solder bumps into contact with the plurality of metal protrusions by moving one or both of the first and second fixtures towards each other;
   rapidly increasing the temperature of the heater from a third temperature to a fourth temperature, the fourth temperature being higher than the first temperature; and
   holding a pulse heat tool approximately at or above the fourth temperature until the plurality of solder bumps have melted and wetted the plurality of metal protrusions.

2. The method of claim 1, wherein the substrate has deposited thereon the plurality of solder bumps, and the chip has affixed thereto a plurality of metal protrusions.

3. The method of claim 1, wherein the second temperature is approximately within a range of 100 to 170 degrees Celsius.

4. The method of claim 1, wherein the third temperature is approximately between 30 to 100 degrees Celsius, and the fourth temperature is approximately between 250 to 400 degrees Celsius.

5. The method of claim 1, wherein rapidly increasing the temperature comprises rapidly increasing the temperature from the third to fourth temperature at a rate of 50 degrees Celsius per second or faster.

6. The method of claim 1, further comprises applying a contact force.

7. The method of claim 1, further comprises removing the contact force once the plurality of solder bumps reach the first temperature.

8. The method of claim 1, wherein the first and second fixtures and the heater comprise a thermo-compression bonder.

9. A method comprising:
   applying metal protrusionS to a plurality of pads on an active surface of a chip, the chip also having second surface opposite the active surface;
   applying solder bumps to a plurality of pads on a top surface of a substrate, the substrate also having a bottom surface, the solder bumps having a melting temperature;
   coating the solder bumps with a no-clean flux, the no-clean flux comprised primarily of constituents having volatilization temperatures that are less than the melting temperature;
   placing the bottom surface of the substrate on a platen of a thermo-compression bonder, the platen being maintained at a first temperature that is less than the volatilization and melting temperatures;
   affixing the second surface of the chip to a head of the thermo-compression bonder, the head including a heater;
   generally aligning the solder bumps with corresponding metal protrusions;
   lowering die head or raising the platen to bring the solder bumps into contact with the metal protrusions;
   applying a contact force to hold the solder bumps and corresponding metal protrusions together;
   increasing the temperature of the heater until the second surface of the substrate reaches a second temperature, the second temperature being greater than the melting temperature; and
   holding the second surface at the second temperature for a period of time until the solder bumps have melted.

10. The method of claim 9, further comprises removing the contact force once the solder bumps begin to melt.

11. The method of claim 9, wherein increasing the temperature of the heater includes a heat-up rate in excess of 30 degree Celsius a second.

12. The method of claim 9, wherein the heater is a pulse heat tool.

* * * * *